United States Patent [19]
Dennison et al.

[11] 3,906,375
[45] Sept. 16, 1975

[54] CONSTANT GAIN SWITCHING AMPLIFIER APPARATUS

[75] Inventors: Charles M. Dennison, Hiawatha; Noel E. Hogue, Cedar Rapids, both of Iowa

[73] Assignee: Rockwell International Corporation, El Segundo, Calif.

[22] Filed: Feb. 8, 1974

[21] Appl. No.: 440,943

[52] U.S. Cl. .................. 328/71; 307/264; 328/133; 328/147; 328/168
[51] Int. Cl. ......................... H03k 17/02; H03k 1/14
[58] Field of Search ...... 307/264; 328/71, 133, 147, 328/149, 168, 170, 173, 175; 330/51; 332/9

[56] References Cited

UNITED STATES PATENTS 3,629,616 12/1971 Walker ............................ 330/51 X
3,831,099 8/1974 Diehl .................................. 328/71

*Primary Examiner*—John Zazworsky
*Attorney, Agent, or Firm*—Bruce C. Lutz

[57] ABSTRACT

A constant gain amplifier having an alternating output which has an average or direct voltage level proportional to an input and which alternating output switches at a frequency in accordance with a control input. This amplifier is used in connection with a phase-locked loop to limit the low-pass filter input voltage swing while automatically adjusting the average of that input voltage over the VCO tuning range as required by the phase-locked loop.

2 Claims, 4 Drawing Figures

CONSTANT GAIN SWITCHING AMPLIFIER APPARATUS

THE INVENTION

The present invention is concerned primarily with electronics and more specifically with phase-locked loops. Even more specifically, the present invention is concerned with an amplifier which allows a reduced low-pass filter attenuation requirement without restricting the available VCO tuning voltage range.

While phase-locked loops are old in art, they have suffered from various deficiencies. Among these deficiencies is the fact that in order to properly operate, the amplifier between the frequency/phase or phase detector and the VCO needed to have a high enough amplitude output to drive the VCO under all designed frequencies. This high voltage output was passed through a low-pass filter to change the detected alternating signal to a direct voltage signal to drive the VCO. Thus, the low-pass filter needed to be designed such that it would provide the proper driving output under a high input signal amplitude.

The present invention provides compensation for the input signal amplitude of the VCO by utilizing the input signal to the VCO to be used as a reference in the amplifier in establishing the average value of the output. The low-pass filter is essentially an integrator and thus the phase detector upon detecting an alteration in frequency with respect to a reference can thereby change the symmetry (i.e. pulse width modulation) of the output alternating signal to thereby add to or subtract from the average output of the amplifier and accordingly from the output of the low-pass filter whereby the VCO is changed in frequency and the input reference to the amplifier is changed in amplitude until the output of the phase detector is again symmetrical thereby indicating that the reference frequency and control frequency have the desired values. Since the output of the filter is being used in maintaining the input level of the signal being integrated by the filter the amplifier requirements for maintaining loop stability are reduced.

It is, thus, an object of the present invention to provide an improved amplifier design.

Other objects and advantages of the present invention will be apparent from a reading of the specification and appended claims in conjunction with the drawings wherein:

FIGURE 1

Figures 1, 2:
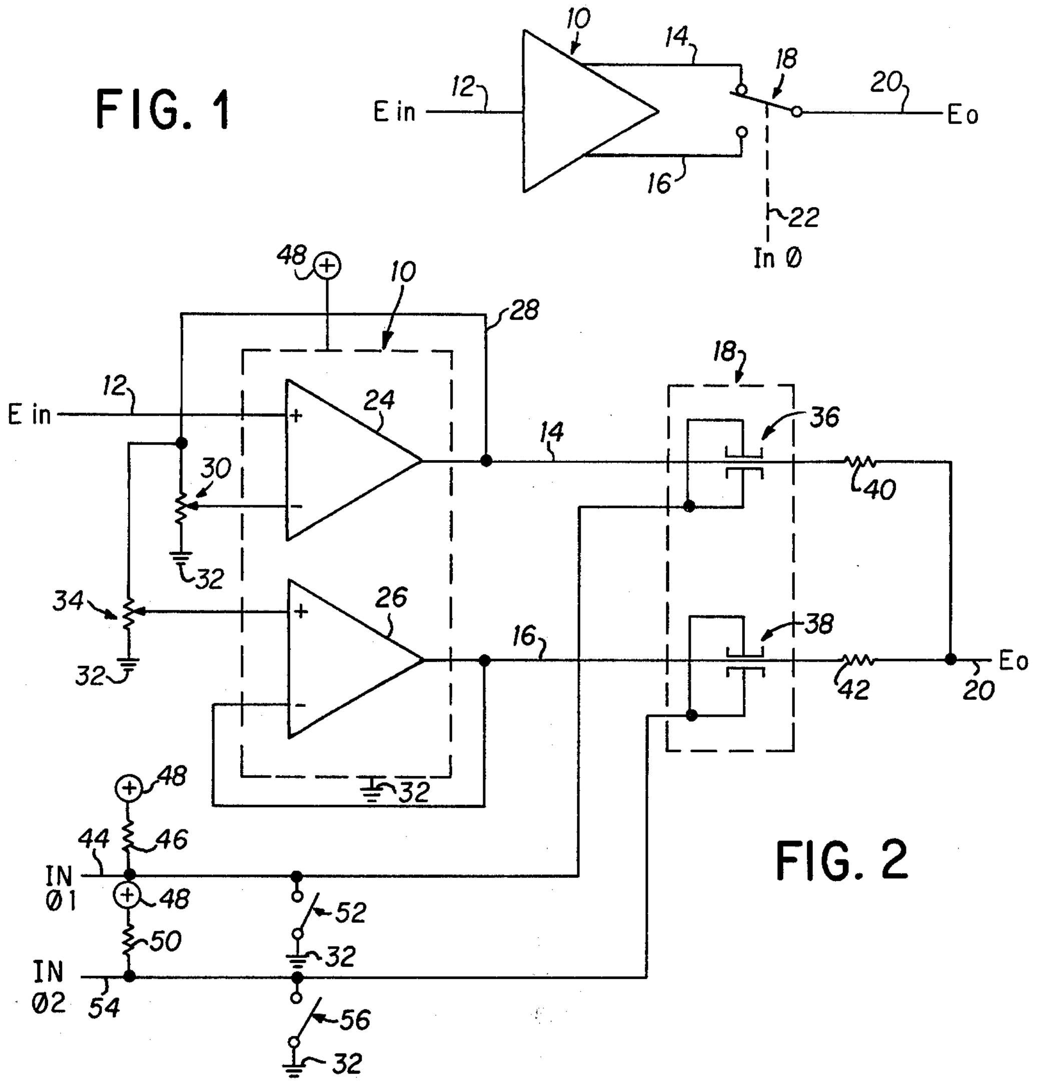
FIG. 1 is a basic block diagram of the amplifier portion of the present invention.
FIG. 2 is a detailed schematic diagram of a preferred embodiment of the present invention.

An amplifier generally designated as 10 has a reference signal input lead 12 and first and second outputs 14 and 16. A double throw switch generally designated as 18 is connected to a common output 20 and moves between the leads 14 and 16 in response to input signals on a modulating input means or phase input lead 22.

In operation, the idealized amplifier 10 increases the voltage level between input 12 and output 14 by a substantially constant amount. The voltage on lead 16 is a given voltage level with respect to 14 and may be either more or less than the voltage level on 14. Thus, as the voltage on 12 increases the voltage on 14 and 16 will also increase as a function thereof with 14 being a prescribed gain value with respect to 12 and with the output lead 16 tracking 14 although having a prescribed voltage differential therebetween. The input signal supplied on lead 22 will operate switch 18 and thereby produce an alternating voltage at output 20. This alternating voltage has a peak-to-peak value which is identical to the voltage differential between leads 14 and 16 and has an average value which is proportional or a function of the input voltage on reference input lead 12.

FIGURES 2 AND 3

In FIG. 2 the same designators are used as were used in FIG. 1. As will be noted an input lead 12 is applied to a first differential amplifier contained within a dash line block and labeled as 10. This first amplifier is designated as 24 while a further differential amplifier is designated as 26. While the amplifiers 24 and 26 may be discrete components, the combination 10 may also be purchased as item MC1458 from Motorola. The lead 12 is connected to the positive or noninverting input of amplifier 24 and the output thereof is connected to lead 14. A feedback line 28 is connected between lead 14 and one end of a potentiomcter generally designated as 30 having a wiper connected to the negative input of amplifier 24 and the other end of the resistive element connected to ground or reference potential 32. Lead 28 is also connected to a potentiometer generally designated as 34 having the other end of the resistance element thereof connected to ground 32 and a wiper connected to a positive input of amplifier 26. An output of amplifier 26 is connected to lead 16 and a feedback lead is connected to the negative input of amplifier 26. The switch generally designated as 18 may comprise any type of switches such as FET's and may be purchased as a commercially available part CD4016 from RCA. Within block 18, is a first switch or field effect transistor 36 and a second switch or field effect transistor 38. The lead 14 passes through field effect transistor 36 within switch 18 to one end of a resistance element 40 having its other end connected to output lead 20. The lead 16 passes through the field effect transistor 38 of switch 18 to a further resistor 42 whose other end is connected to output lead 20. A phase one ($In0_1$) input lead 44 is connected to one end of a resistance element 46 whose other end is connected to a positive power supply source 48. This positive power supply also supplied power to amplifier 10 as well as to a second resistance element 50. A switch 52 is connected between lead 44 and ground 32 and lead 44 is also connected as a control input to FET 36. A phase two ($In0_1$) input 54 is connected to the other end of resistance element 50 and is connected to the control input of FET 38. A switch 56 is connected between lead 54 and ground 32. The two signals on leads 44 and 54 are of opposite phase and provide the modulating input function of 22 in FIG. 1.

In operation, the amplifier of FIG. 2 is initially adjusted by feeding a prescribed input voltage on lead 12. Switch 56 is then closed to open FET 38 and thus prevent passage of current therethrough. Switch 52 is opened to allow current to be passed from amplifier 24 to output 20 since the opening of switch 52 allows the positive voltage from source 48 to effectively apply a logic one input signal to FET 36. The potentiometer 30 is then adjusted via the wiper connected to the negative input of amplifier 24 until the output voltage on lead 20 is slightly above the input voltage on lead 12. Then, switch 52 is closed and switch 56 is opened and the wiper on potentiometer 34 is adjusted so that the voltage at output lead 20 is slightly less than the voltage on input lead 12. The last setting of switches 52 and 56 allows passage of the signal from the output of amplifier 26 to output 20 rather than from the output from amplifier 24. Switch 52 is then opened to allow the switching amplifier to operate normally.

Figure 3:
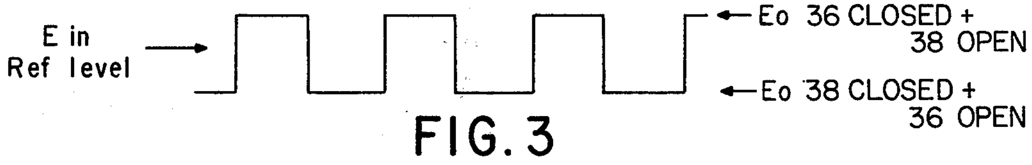
FIG. 3 is an illustration of a waveform obtained from the schematic of FIG. 2.
Figure 4:
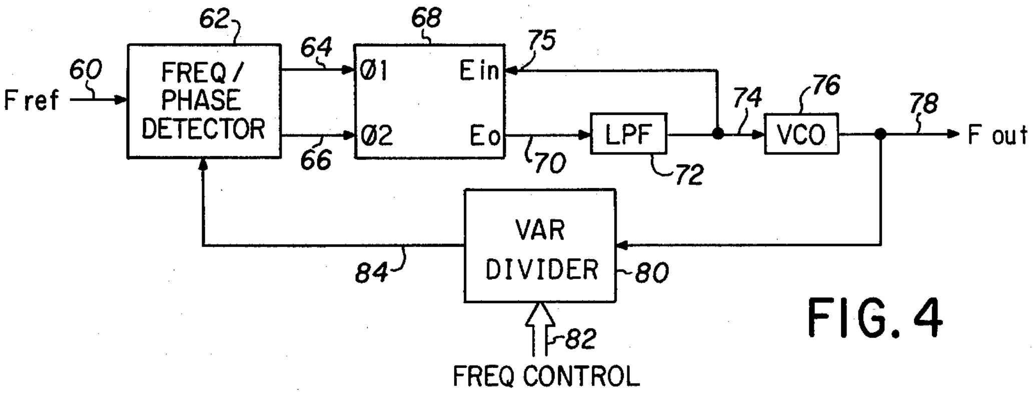
FIG. 4 illustrates a phase-lock loop incorporating the inventive concept.

If the gain of the amplifiers of FIG. 2 is set so that there is a voltage gain of one (1) from input 12 to output 20, the diagram of FIG. 3 will apply. In other words, the output voltage will vary about the input voltage and will have an amplitude deviation from the input voltage in accordance with the setting of the two potentiometers 30 and 34. The signals applied to inputs 44 and 54 are control signals which are 180° out-of-phase such that the appearance of a logic 1 on one of the inputs will result in a logic 0 input on the other. As will be realized by those skilled in the art, switches 52 and 56 are both in an open condition in normal operation and only one of 36 and 38 are closed at any given time.

FIGURE 4

A reference frequency input is labeled 60 and applies a reference input signal to block 62 which is a frequency phase detector. This frequency phase detector may be of any standard design including that illustrated in U.S. Pat. No. 3,431,509 and assigned to the assignee of the present invention. The design of the above-mentioned detector included first and second outputs for the control switching signal and thus two detector outputs are illustrated in this embodiment of a phase-lock loop. However, as will be realized, the switching functions may also be accomplished using a single control switching signal input as illustrated in FIG. 1. The detector 62 has outputs 64 and 66 applied to a block 68 which basically comprises the components shown in FIG. 2. An output lead 70 of block 68 provides output signals to a low-pass filter 72 which has an output on lead 74 which is applied to the reference input voltage terminal 76 of block 68 as well as to a control input of a VCO or voltage controlled oscillator 76. This oscillator 76 may also be termed a variable frequency controlled oscillator. An output of VCO 76 is applied on lead 78 to an output frequency terminal and is also fed back as an input to a variable divider 80. Variable divider 80 includes a frequency control input 82 for determining the division ratio of input to output voltages and supplies the output voltage on a lead 84 to a comparison input of detector 62.

In operation, the phase detector 62 compares the reference frequency on lead 60 with the frequency of the signal appearing on 84. If there is a difference in frequency and/or phase an unsymmetrical output will appear in the alternating voltage signals appearing on leads 64 and 66. This unsymmetrical output may be termed pulse-width modulated. The two signals on 64 and 66 will merely be 180° out-of-phase but the logicc one portions thereof will be of a different duration than the logic zero portions thereof. The effects of this unsymmetrical signal will be passed through amplifier switch 68 to the low-pass filter 72 since the signal passed has a voltage component. The low-pass filter 72 acts as an integrator and either increases or decreases the stored integrated voltage level in accordance with the deviation of the frequency on lead 84 with respect to the reference frequency 60 to change the frequency of VCO 76 toward the desired value. This change in voltage is also fed back to the input 75 of amplifier 68 to thereby alter the average value of the output voltage on lead 70. The variable divider 80 divides the output frequency appearing at lead 78 by the amount determined from input control signals on leads 82 and as the divided frequency output on lead 84 approaches that appearing on lead 60, the output signals from detector 62 approaches symmetry. When these outputs are again symmetrical, the control voltage output from low-pass filter will stabilize and remain at a given value until the control input at 82 again changes.

As will be realized by those skilled in the art, the normal design VCO requires higher input voltages for increasing frequencies. A normal design of a VCO is such that the frequency of the VCO output increases as the input voltage increases or alternatively as the output frequency of the VCO increases the input voltage increases. Thus, the amplifiers in the position of amplifier 68 in the prior art needed to have a large enough amplitude output as a result of the switching signal input on leads 64 and 66 to assure an output from low-pass filter 72 which would not only vary the frequency of VCO 76 but be large enough to tune the frequency ranges of VCO 76. In the present invention, the direct voltage level or average level output of amplifier 68 increases as a function of that applied to input 75 from lead 74, thus low-pass filter need be sufficient only to accommodate the small alternating signal component of the total signal applied on lead 70.

The total effect of the design of the present amplifier is to decrease the requirement for attenuation in low-pass filter 72 from a low-pass filter with a large amount of attenutation to a low-pass filter with substantially reduced attenuation. This is allowable since the output from amplifier 68 is a signal which varies in average value and has a very small alternating component superimposed thereupon. Thus, the integrating function of the low-pass filter must only remove this small alternating component from amplifier 68 to produce the direct voltage required to tune VCO 76.

A broad block diagram and a preferred embodiment have been illustrated for the amplifier and the amplifier as conceived in the inventive concept is illustrated in a specific phase-lock loop. As will be realized by those skilled in the art various alterations may be made within the concept of the invention and thus the applicant wishes to be limited not by the specific apparatus shown but rather by the scope of the appended claims.

We claim:

1. Amplifying apparatus comprising, in combination:
first means for supplying reference input signals;
second means for supplying pulse width modulated constant frequency input signals;
apparatus output means;
third means, including reference signal input means, modulating input means and output means, for supplying alternating signals at said output means thereof which have an average value directly proportional to the average value of a reference signal supplied to said reference signal input means thereof and wherein the average value is also directly proportional to the pulse width of a signal supplied to said modulating input means thereof;

means connecting said first means to said reference signal input means of said third means;

means connecting said second means to said modulating input means of said third means; and means connecting said apparatus output means to said output means of said third means.

2. Apparatus as claimed in claim 1 wherein said third means includes:

first and second amplifying means each including outputs and first and second inputs;

means connecting said reference signal input means of said third means to said first input of said first amplifying means;

means connecting said output of said first amplifying means to said output means of said third means and to said second input of said first amplifying means as well as to said first input of said second amplifying means; and means connecting said output of said second amplifying means to said output means of said third means as well as to said second input of said second amplifying means.

* * * * *